(12) United States Patent
Ye et al.

(10) Patent No.: US 7,549,790 B2
(45) Date of Patent: Jun. 23, 2009

(54) MEASURING APPARATUS FOR THERMAL RESISTANCE OF HEAT DISSIPATING DEVICE

(75) Inventors: Zhen-Xing Ye, Shenzhen (CN); Xiao-Zhu Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 44 days.

(21) Appl. No.: 11/927,709

(22) Filed: Oct. 30, 2007

(65) Prior Publication Data
US 2008/0165824 A1 Jul. 10, 2008

(30) Foreign Application Priority Data
Jan. 4, 2007 (CN) .................... 2007 1 0200005

(51) Int. Cl.
*G01N 25/00* (2006.01)
*G01K 1/00* (2006.01)
*G01K 13/00* (2006.01)
*G01K 17/00* (2006.01)
*H05K 7/20* (2006.01)
*H01L 23/34* (2006.01)

(52) U.S. Cl. .................... 374/43; 374/141; 374/208; 374/163; 702/132; 702/136; 361/697; 361/710; 257/713; 257/719; 257/721

(58) Field of Classification Search ............... 374/43, 374/208, 141, 163; 702/132, 136; 361/697, 361/710; 257/713, 719, 721
See application file for complete search history.

(56) References Cited

U.S. PATENT DOCUMENTS

| | | | | |
|---|---|---|---|---|
| 6,067,227 A * | 5/2000 | Katsui et al. | ................ | 361/695 |
| 6,143,977 A * | 11/2000 | Kitahara et al. | ............. | 361/697 |
| 6,330,908 B1 * | 12/2001 | Lee et al. | .................... | 361/697 |
| 6,663,278 B1 * | 12/2003 | Chien et al. | ................... | 374/43 |
| 2005/0207118 A1 * | 9/2005 | Wang et al. | ................. | 361/695 |
| 2007/0000645 A1 * | 1/2007 | Tung et al. | .................. | 361/697 |
| 2007/0159798 A1 * | 7/2007 | Chen et al. | .................. | 361/700 |
| 2007/0253161 A1 * | 11/2007 | Liu et al. | ..................... | 361/695 |
| 2008/0040067 A1 * | 2/2008 | Bashor et al. | .............. | 702/132 |
| 2008/0049397 A1 * | 2/2008 | Long et al. | .................. | 361/697 |
| 2008/0066898 A1 * | 3/2008 | Lai et al. | .................... | 361/697 |

* cited by examiner

*Primary Examiner*—Gail Verbitsky
*Assistant Examiner*—Mirellys Jagan
(74) *Attorney, Agent, or Firm*—Frank R. Niranjan

(57) ABSTRACT

A measuring apparatus for measuring the thermal resistance of a heat dissipating device, the heat dissipating device includes a fan and a heat sink. The measuring apparatus includes a base, and a fixing member. The base receives a heat element and the heat sink therein. The base includes a bottom wall, and two opposite sidewalls perpendicular to the bottom wall. The fixing member is placed on the heat sink, and two ends of the fixing member are slidably connected to the sidewalls of the base. A plurality of groups of fixing holes is defined in the fixing member for fixing different size fans.

15 Claims, 6 Drawing Sheets

MEASURING APPARATUS FOR THERMAL RESISTANCE OF HEAT DISSIPATING DEVICE

BACKGROUND

1. Field of the Invention

The present invention relates to a measuring apparatus, and more particularly to a measuring apparatus for measuring thermal resistance of heat dissipating devices.

2. Description of Related Art

An equipment chassis, such as a computer chassis, usually includes a heat dissipating device which includes a heat sink, and a fan installed on a heat generating component thereof for dissipating heat. The thermal resistance of the heat dissipating device is an important parameter to judge the performance of the heat dissipating device.

What is needed, therefore, is a measuring apparatus for measuring the thermal resistance of different heat dissipating devices.

SUMMARY

An exemplary measuring apparatus for measuring the thermal resistance of a heat dissipating device, the heat dissipating device includes a fan and a heat sink. The measuring apparatus includes a base, and a fixing member. The base receives a heat element and the heat sink therein. The base includes a bottom wall, and two opposite sidewalls perpendicular to the bottom wall. The fixing member is placed on the heat sink, and two ends of the fixing member are slidably connected with the sidewalls of the base. A plurality of groups of fixing holes is defined in the fixing member for fixing different size fans.

Other advantages and novel features will become more apparent from the following detailed description of embodiment when taken in conjunction with the accompanying drawings, in which:

DETAILED DESCRIPTION

Figure 1:
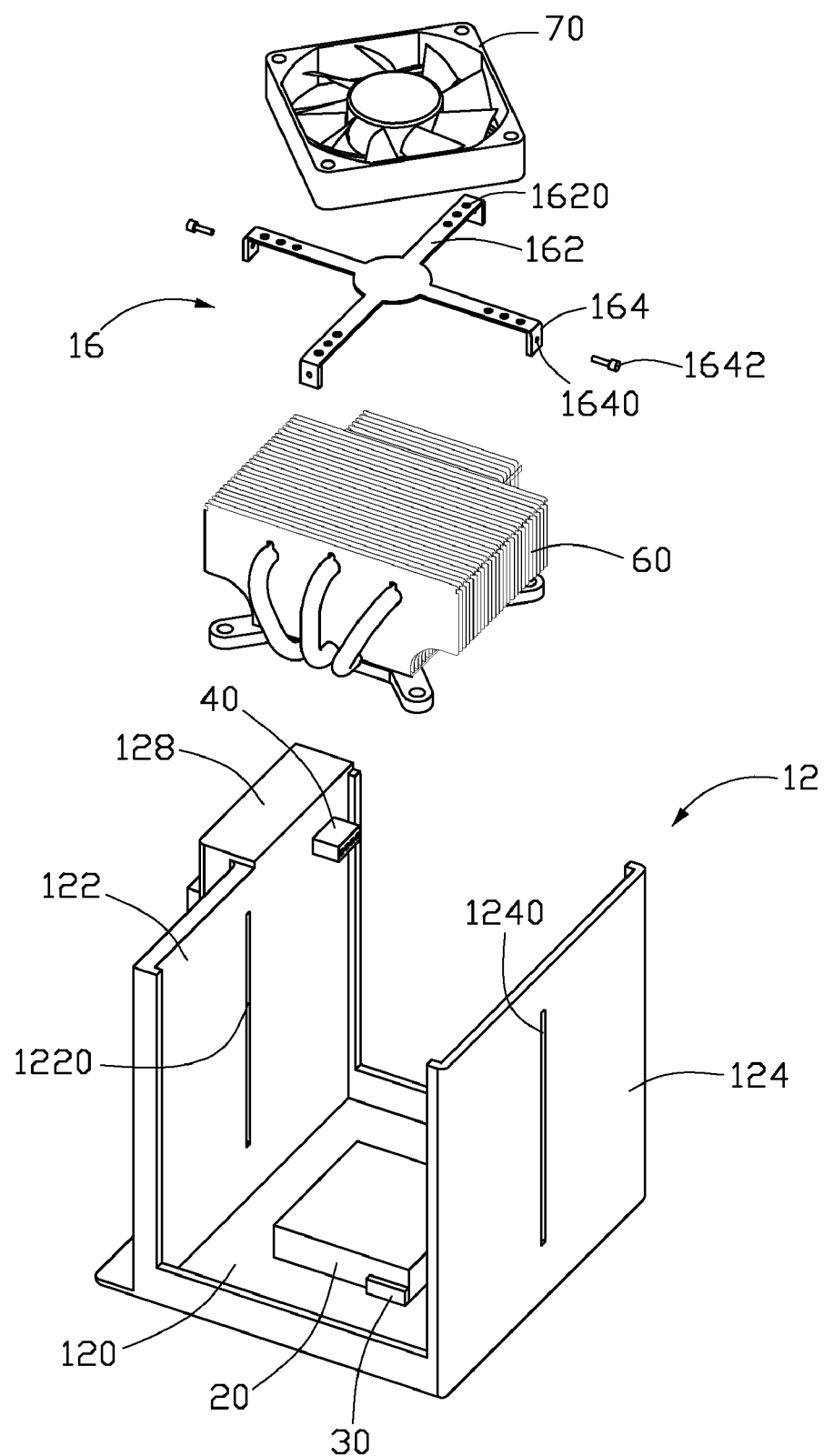
FIG. 1 is an exploded, isometric view of a measuring apparatus in accordance with an embodiment of the present invention with a heat sink and a fan, the measuring apparatus includes a base, a control member, and a fixing member.
Figure 2:
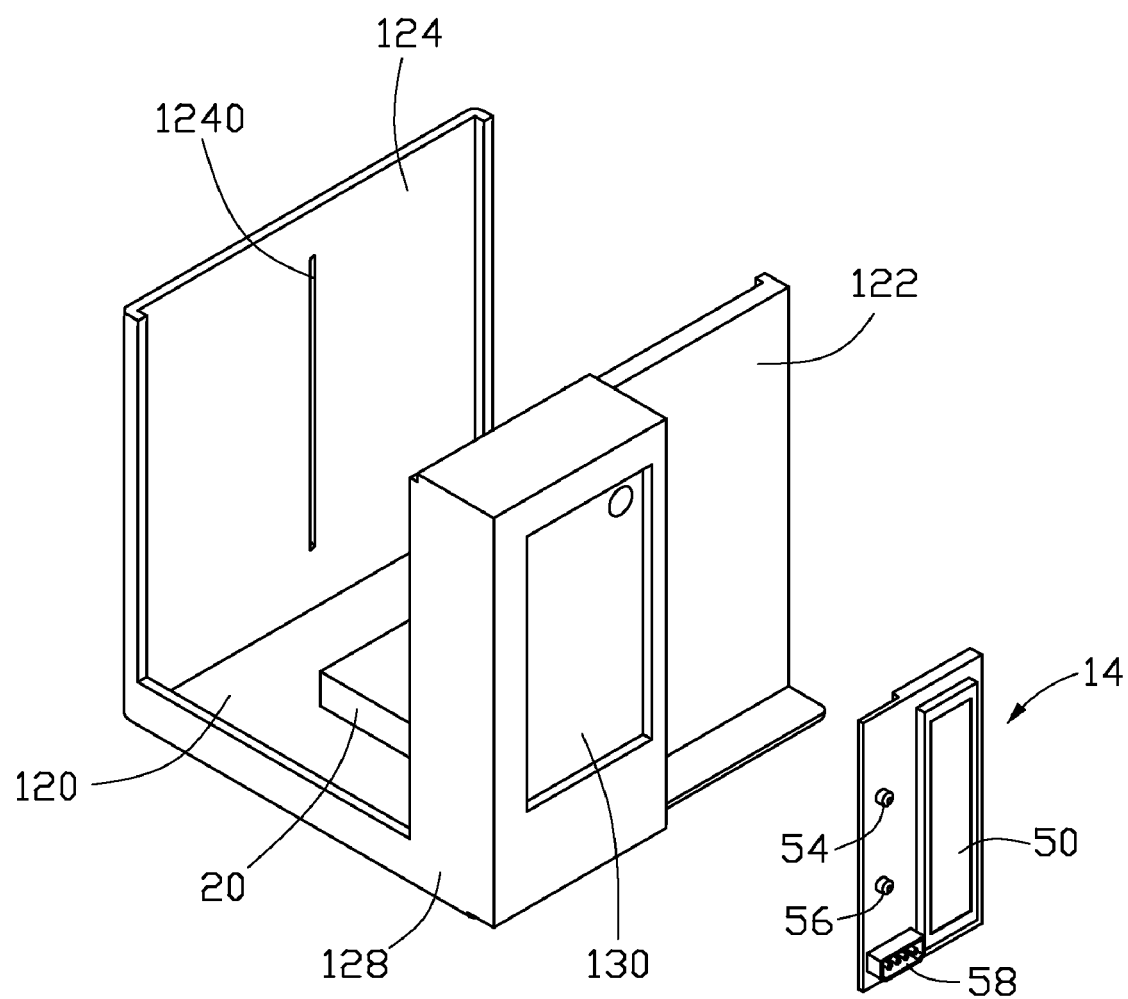
FIG. 2 is an exploded, isometric view of the base, and the control member of FIG. 1, but viewed from another aspect.
Figure 3:
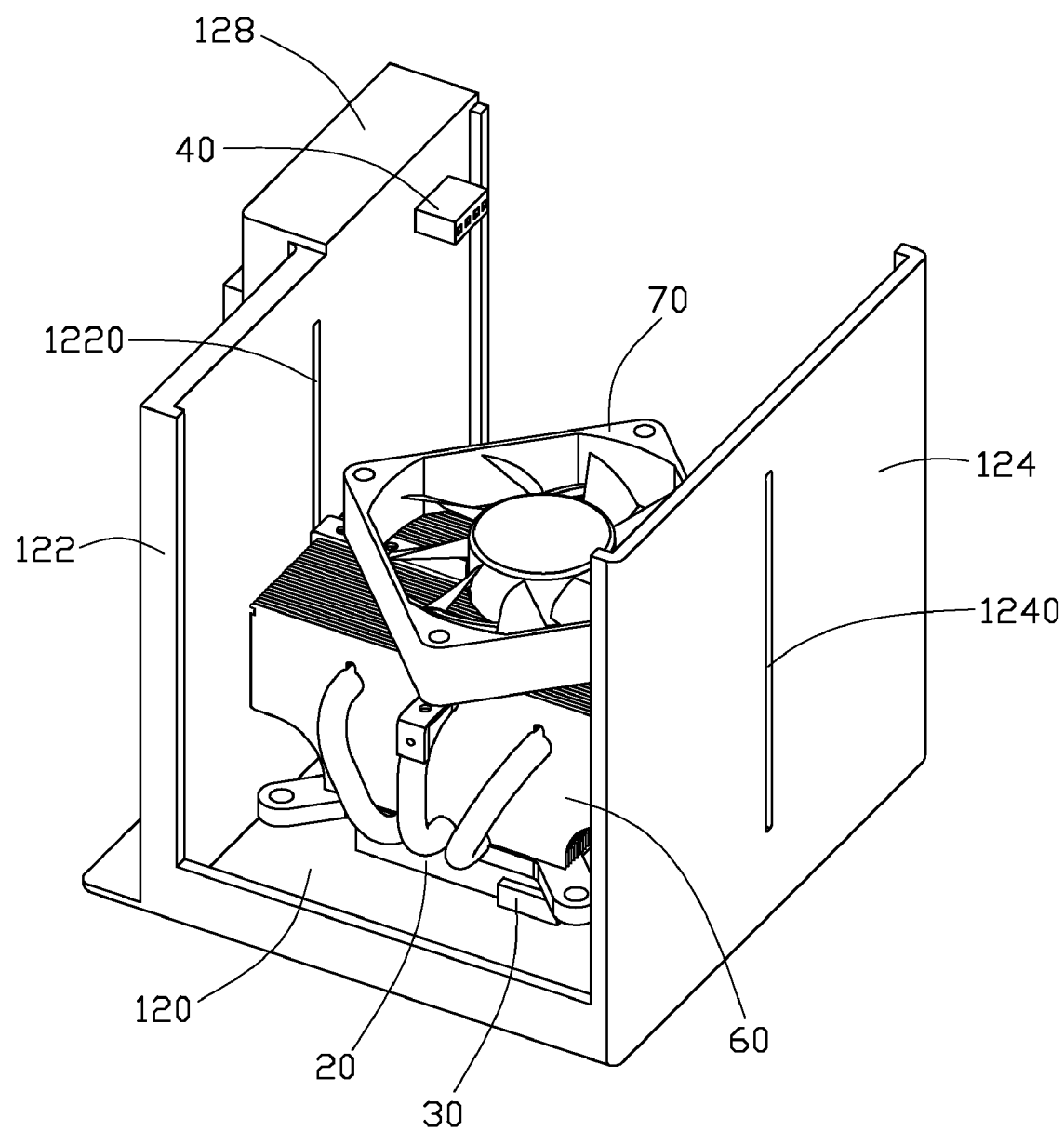
FIGS. 3 and 4 are assembled views of FIG. 1, but viewed from two different aspects respectively.
Figure 4:
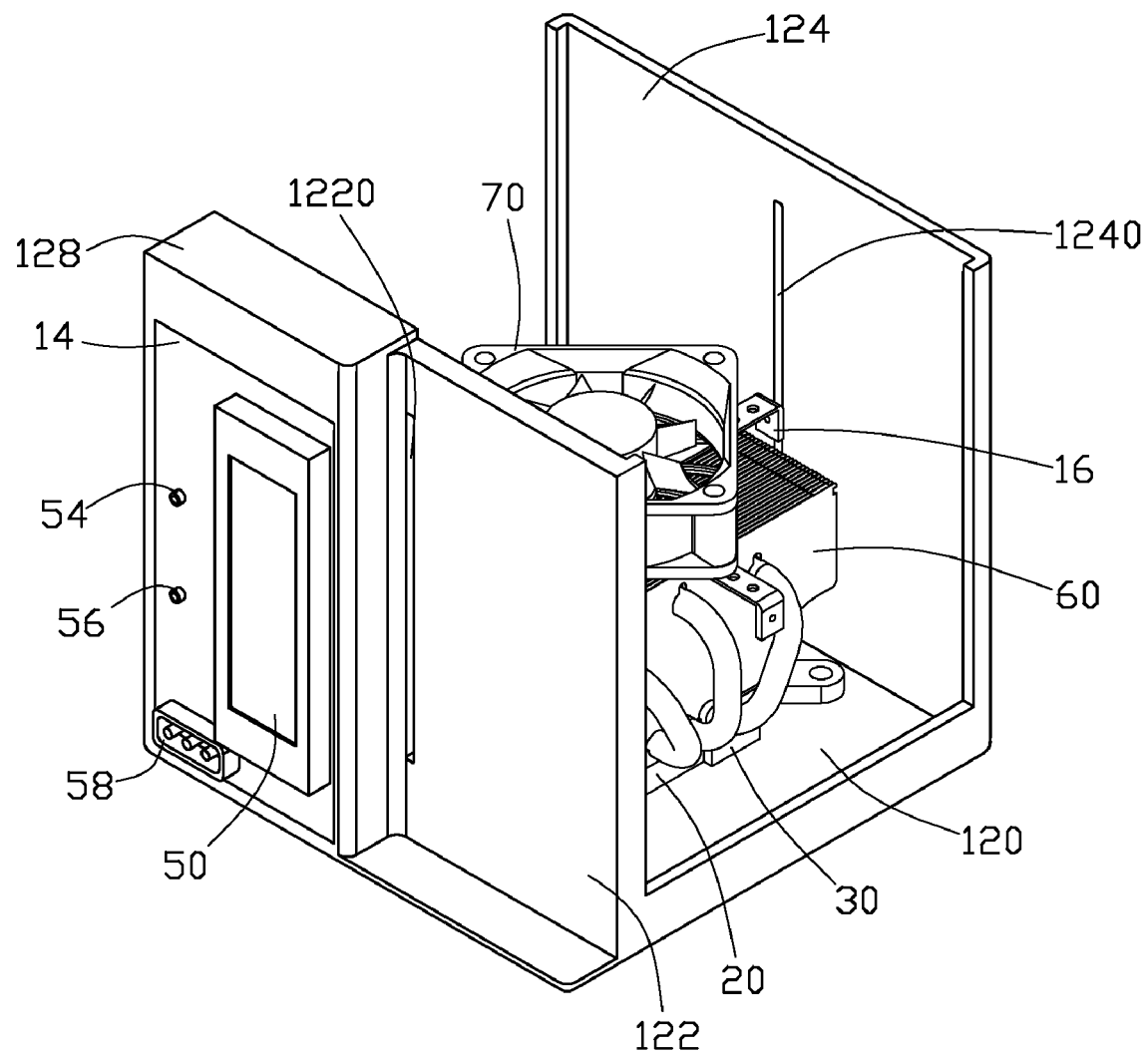
Figure 5:
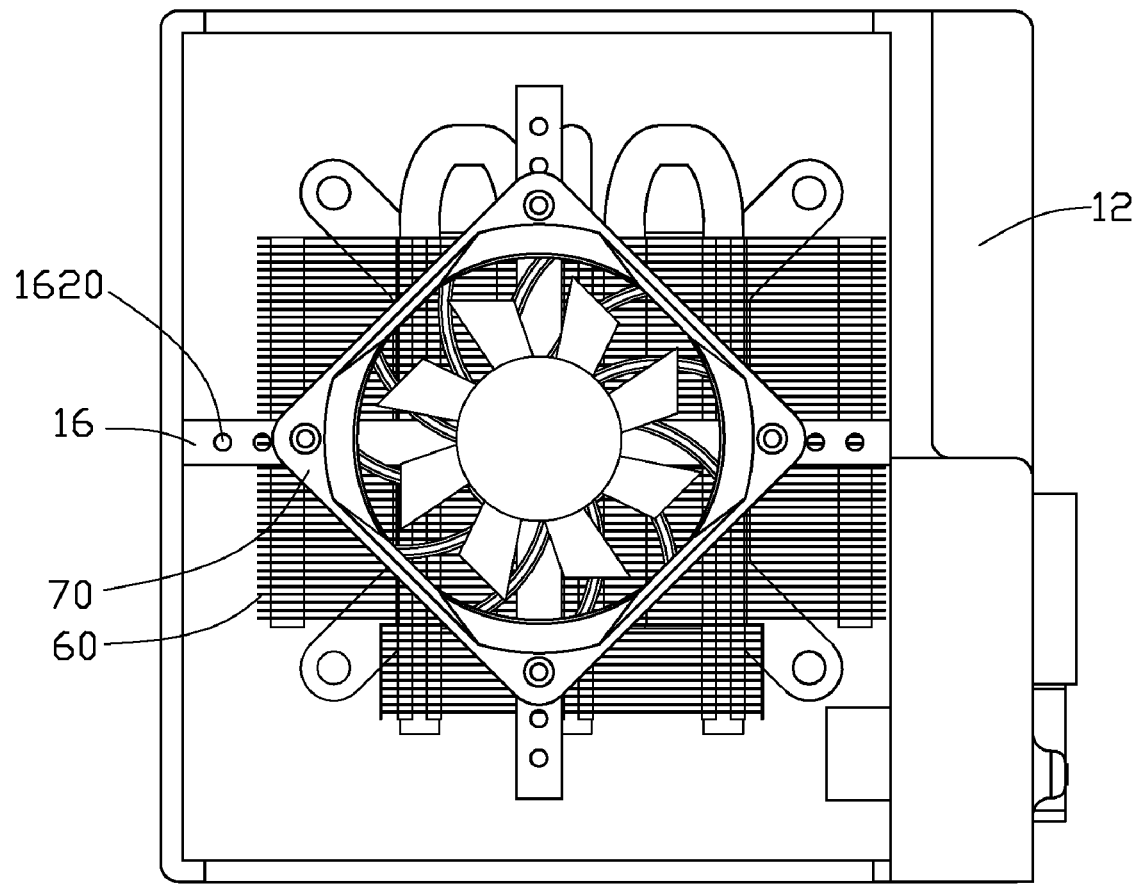
FIGS. 5 and 6 are top plan views of FIG. 3, respectively showing the measuring apparatus with two different size fans.
Figure 6:
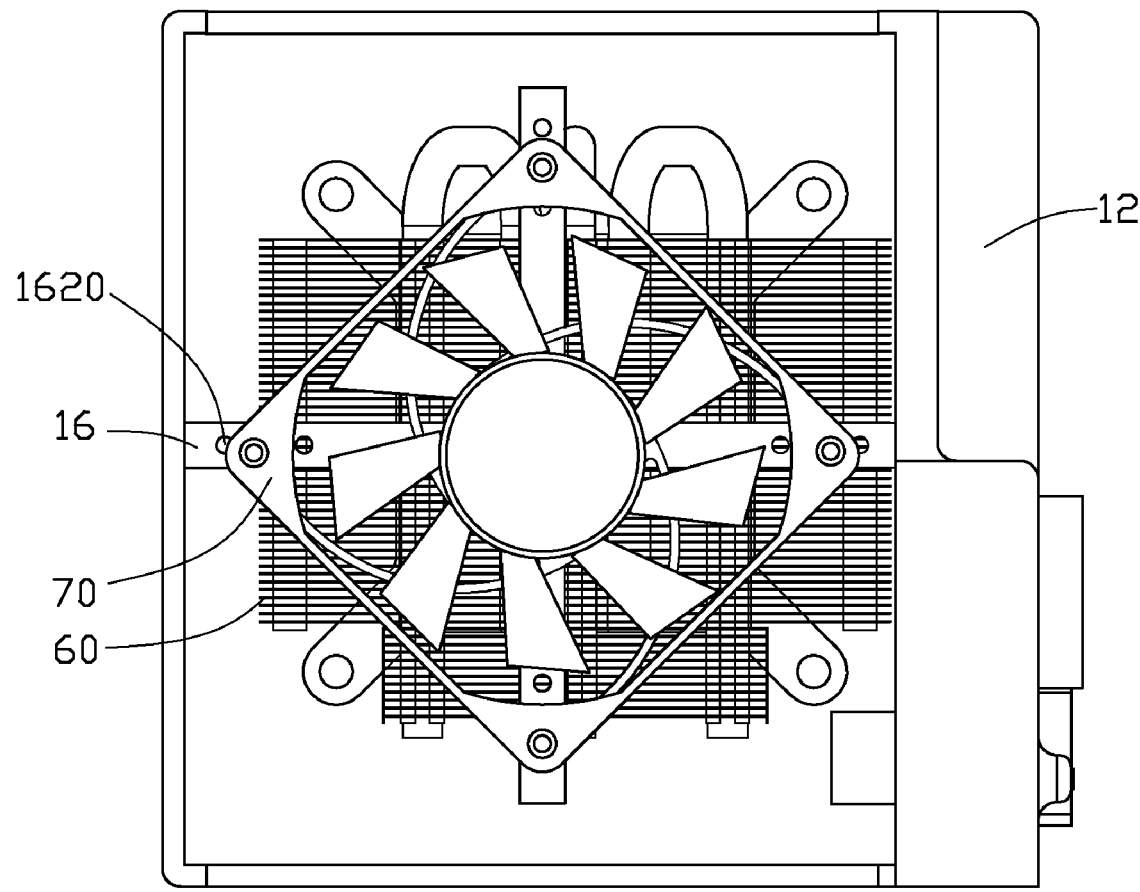

Referring to FIGS. 1 and 2, a measuring apparatus is provided in accordance with a first embodiment of the present invention for measuring thermal resistance of a heat dissipating device. The measuring apparatus includes a base 12, a control member 14, and a fixing member 16. In this embodiment, the heat dissipating device includes a heat sink 60, and a fan 70.

The base 12 includes a bottom wall 120. A first sidewall 122, and a second sidewall 124 are perpendicularly formed at opposite sides of the bottom wall 120. Two elongated slots 1220, 1240 perpendicular to the bottom wall 120 are defined in the first and second sidewalls 122, 124 respectively. A heat element 20, together with a temperature sensor 30 attached to the heat element 20, is mounted on the bottom wall 120. A connector 40 is installed on the inside surface of the first sidewall 122. A fixing portion 128 protrudes from a portion beside the elongated slot 1220 on the outside surface of the first sidewall 122. A recessed portion 130 is defined in the fixing portion 128.

The control member 14 includes a circuit board having a microprocessor therein. A display 50, a power button 54, a reset button 56 for resetting the control member 14, and a connector 58 are installed on the outer surface of the control member 14. The connector 58 is electrically connected to a power supply (not shown) for providing power to the measuring apparatus and the connector 40 on the base 12.

The fixing member 16 includes four supporting arms 162 extending radially from a circular middle portion thereof, and each two opposite supporting arms 162 are arranged in a line. Four groups of fixing holes 1620 are respectively defined in the supporting arms 162, for fitting different size fans 70. A fixing portion 164 extends perpendicularly from a free end of each supporting arm 162, and a bore 1640 is defined in each fixing portion 164.

Referring further to FIGS. 3 to 6, in assembly, the control member 14 is installed in the recessed portion 130 of the fixing portion 128 of the base 12 and electrically connected to the heat element 20 and the temperature sensor 30. The heat sink 60 is placed on the heat element 20, and the fixing member 16 is placed on the heat sink 60, with the bores 1640 of two aligned supporting arms 162 aligning with the elongated slots 1220, 1240 of the first and second sidewalls 122, 124 of the base 12 respectively. Two fasteners 1642 extend through the elongated slots 1220, 1240 of the first and second sidewalls 122, 124 respectively and then engage in the bores 1640 of the corresponding supporting arms 162, thereby the fixing member 16 is fixed to the base 12. The fasteners 1642 are slidable in the corresponding elongated slots 1220, 1240, to allow the fixing member 16 to fit heat sinks 60 of various heights. Thereafter, the fan 70 is placed on the fixing member 16, with four fixing holes respectively defined in four corners of the fan 70 aligning with the corresponding fixing holes 1620 of the supporting arms 162 of the fixing member 16. A plurality of fasteners (not shown) extends through the fixing holes of the fan 70 respectively and then engages in the corresponding fixing holes 1620 of the fixing member 16, thereby the fan 40 is fixed to the fixing member 16.

The fan 70 is electrically connected to the connector 40 of the base 12. Turning on the power button 54 of the control member 14, the heat element 20 generates heat and the heat dissipating device works. The temperature sensor 30 collects the temperature of the heat element 20 and sends it to the microprocessor of the circuit board of the control member 14. The microprocessor calculates the thermal resistance of the heat dissipating device and outputs the thermal resistance to the display 50, thereby the thermal resistance of the heat dissipating device can be viewed by a user.

It is believed that the present embodiment and its advantages will be understood from the foregoing description, and it will be apparent that various changes may be made thereto without departing from the spirit and scope of the invention or sacrificing all of its material advantages, the example hereinbefore described merely being preferred or exemplary embodiment of the invention.

What is claimed is:

1. A measuring apparatus for the thermal resistance of a heat dissipating device, the heat dissipating device comprising a heat sink, the measuring apparatus comprising:

a base receiving a heat element and the heat sink therein, the base comprising a bottom wall, and two opposite sidewalls perpendicular to the bottom wall; and a fixing member placed on the heat sink, two ends of the fixing member slidably connected to the sidewalls of the base, a plurality of groups of fixing holes defined in the fixing member capable of fixing different size fans.

2. The measuring apparatus as claimed in claim 1, wherein the fixing member comprises four supporting arms, and the groups of fixing holes are respectively defined in the supporting arms.

3. The measuring apparatus as claimed in claim 2, wherein the supporting arms extend radially from a middle portion of the fixing member, and each two opposite supporting arms are arranged in a line.

4. The measuring apparatus as claimed in claim 3, wherein free ends of two opposite supporting arms each forms a vertical fixing portion, each fixing portion defines a bore therein, a slot is defined in each of the sidewalls, two fasteners extend through the slots of the sidewalls respectively and engage in the bores of the corresponding fixing portions of the fixing member.

5. The measuring apparatus as claimed in claim 4, wherein the slots of the sidewalls are elongated and perpendicular to the bottom wall, the fasteners are slidably received in the slots.

6. The measuring apparatus as claimed in claim 1, wherein a temperature sensor attached to the heat element is mounted on the bottom wall of the base, the measuring apparatus further comprises a control member electrically connected to the temperature sensor for calculating the thermal resistance of the heat dissipating device.

7. The measuring apparatus as claimed in claim 6, wherein a fixing portion protrudes from an outside surface of one of the sidewalls, a recessed portion is defined in the fixing portion, the control member is installed in the recessed portion.

8. The measuring apparatus as claimed in claim 6, wherein the control member comprises a circuit board with a microprocessor, a display for showing the thermal resistance, a power button, a reset button, and a connector electrically connected to a power supply.

9. The measuring apparatus as claimed in claim 8, wherein a connector electrically connected to the control member is installed on the base for providing power to the fan in the base.

10. A measuring apparatus for the thermal resistance of a heat dissipating device, the heat dissipating device comprising a fan and a heat sink, the measuring apparatus comprising:

a base receiving a heat element and a temperature sensor attached to the heat element therein, the base comprising a bottom wall, and two opposite sidewalls perpendicular to the bottom wall;

a fixing member placed on the heat sink for fixing the fan, two ends of the fixing member slidably connected to the sidewalls of the base; and a control member electrically connected to the temperature sensor for calculating the thermal resistance of the heat dissipating device.

11. The measuring apparatus as claimed in claim 10, wherein a fixing portion protrudes from an outside surface of one of the sidewalls, a recessed portion is defined in the fixing portion, the control member is installed in the recessed portion.

12. The measuring apparatus as claimed in claim 10, wherein the control member comprises a circuit board with a microprocessor for calculating the thermal resistance, and a display for showing the thermal resistance.

13. The measuring apparatus as claimed in claim 10, wherein the fixing member comprises four supporting arms, and four groups of fixing holes are respectively defined in the supporting arms for fixing different size fans.

14. The measuring apparatus as claimed in claim 13, wherein the supporting arms extend radially from a middle portion of the fixing member, and each two opposite supporting arms are arranged in a line.

15. The measuring apparatus as claimed in claim 14, wherein free ends of two opposite supporting arms each forms a vertical fixing portion, each fixing portion defines a bore therein, an elongated slot is defined in each of the sidewalls perpendicular to the bottom wall, two fasteners extend through the slots of the sidewalls respectively and engage in the bores of the corresponding fixing portions of the fixing member.

* * * * *